(12) United States Patent
Inhofer et al.

(10) Patent No.: US 9,982,664 B2
(45) Date of Patent: May 29, 2018

(54) SYSTEMS AND METHODS FOR METERING A DOSE VOLUME OF FLUID USED TO TREAT MICROELECTRONIC SUBSTRATES

(71) Applicant: TEL FSI, Inc., Chaska, MN (US)

(72) Inventors: William P. Inhofer, Plymouth, MN (US); Lance Van Elsen, Oakdale, MN (US)

(73) Assignee: TEL FSI, Inc., Chaska, MN (US)

( * ) Notice: Subject to any disclaimer, the term of this patent is extended or adjusted under 35 U.S.C. 154(b) by 0 days. days.

(21) Appl. No.: 14/815,467

(22) Filed: Jul. 31, 2015

(65) Prior Publication Data

US 2017/0028418 A1  Feb. 2, 2017

(51) Int. Cl.
| | |
|---|---|
| *C23F 1/00* | (2006.01) |
| *F04B 23/04* | (2006.01) |
| *C08J 7/00* | (2006.01) |
| *B05B 11/00* | (2006.01) |
| *B81C 1/00* | (2006.01) |
| *F04B 19/00* | (2006.01) |
| *H01L 21/306* | (2006.01) |

(52) U.S. Cl.
CPC .......... *F04B 23/04* (2013.01); *B05B 11/3032* (2013.01); *B81C 1/00539* (2013.01); *C08J 7/00* (2013.01); *F04B 19/006* (2013.01); *H01L 21/30604* (2013.01)

(58) Field of Classification Search
CPC ......... H01L 21/67103; H01L 21/67248; H01L 21/30604; C23F 1/46; G06F 17/30247; G06F 3/011; G06T 11/60; B05B 11/3033; B05B 11/3032; F04B 19/006; B81C 1/00539

USPC .......... 216/83, 84, 93; 438/745; 156/345.1, 156/345.11, 345.15, 345.17
See application file for complete search history.

(56) References Cited

U.S. PATENT DOCUMENTS 5,083,364 A  1/1992  Olbrich et al.
5,320,139 A  6/1994  Paul et al.
(Continued)

FOREIGN PATENT DOCUMENTS

CN  102157357 A  8/2011
CN  103456665 A  12/2013
(Continued)

OTHER PUBLICATIONS

International Search Report and Written Opinion from International Application No. PCT/US2016/043508, dated Oct. 17, 2016 (13 pages).

*Primary Examiner* — Lan Vinh
(74) *Attorney, Agent, or Firm* — Kagan Binder, PLLC

(57) ABSTRACT

The disclosure relates to systems and methods for metering a dose volume of fluid that may be used to treat microelectronic substrates. The system enables precision dispensing of relatively small amounts of a liquid chemical into a chemical bath or processing chamber for microelectronic substrates. The dispensing device may include a fluid conduit with a plurality of actuation devices that may limit fluid communication between the actuation devices and store a portion of the fluid in expandable membrane. The actuation devices may push or pull the fluid within the fluid conduit when the expandable membrane expands or contracts. The configuration and operation of the actuation devices may enable the collection, isolation, and dispensing of the dose volume.

16 Claims, 7 Drawing Sheets

(56) References Cited

U.S. PATENT DOCUMENTS

| | | | |
|---|---|---|---|
| 5,996,420 A | 12/1999 | Lee | |
| 9,275,852 B2 | 3/2016 | Kim et al. | |
| 2002/0011253 A1 | 1/2002 | Puri et al. | |
| 2002/0112746 A1 | 8/2002 | DeYoung et al. | |
| 2004/0224865 A1 | 11/2004 | Roeder et al. | |
| 2005/0199277 A1 | 9/2005 | Scranton | |
| 2007/0224727 A1 | 9/2007 | Dory | |
| 2008/0185714 A1 | 8/2008 | Ramanathan et al. | |
| 2012/0257354 A1 | 10/2012 | Dede | |
| 2013/0318815 A1* | 12/2013 | Kim | H01L 21/67017 34/487 |
| 2014/0262199 A1* | 9/2014 | Kobayashi | G05D 23/1934 165/294 |
| 2015/0117135 A1* | 4/2015 | Chen | B24B 37/04 366/142 |

FOREIGN PATENT DOCUMENTS

| | | |
|---|---|---|
| JP | 2004158534 A | 6/2004 |
| TW | 201512464 A | 4/2015 |

\* cited by examiner

US 9,982,664 B2

SYSTEMS AND METHODS FOR METERING A DOSE VOLUME OF FLUID USED TO TREAT MICROELECTRONIC SUBSTRATES

FIELD OF USE

The disclosure relates to an apparatus and method for treating the surface of a microelectronic substrate, and in particular, an apparatus and method for dispensing a relatively small amount of fluid into a larger amount of fluid or into a process chamber or bath.

BACKGROUND

Integrated circuits (ICs) may be formed on microelectronic substrates, such as semiconductor substrates, through successive process treatments that form structures that perform electrical functions as needed. The size and density of the structures has continued to decrease to improve performance and cost of the ICs. The processing treatments may be enabled by controlling the environment around the microelectronic substrate in a particular manner, such that the temperature, pressure, and/or chemical concentration enable a desired result on the microelectronic substrate. The process treatments may be finely controlled to enable the formation of the structures by increasing chemical reaction selectivity and/or cleaning efficiency within the wet chemical treatment space. Accordingly, the concentration of the treatment chemicals may have a large impact on the effectiveness of process treatments to the microelectronic substrate. In certain instances, the process treatments may use a relatively small amount of one chemical in combination with a larger amount of another chemical to treat the microelectronic substrate. The ability to alter the chemical concentration of the process treatment chemicals in a consistent and repeatable manner may be desirable. Hence, systems and methods used to control the chemical concentration of process treatments may be desirable.

SUMMARY OF THE INVENTION

Described herein are devices and methods for dispensing small amounts of a dose chemical into a larger volume of a carrier chemical that may deliver the dose chemical to the microelectronic substrate or alter the carrier chemical prior to treating the microelectronic substrate. The dispensing system may control the amount of dose chemical by priming or pressurizing the fluid within the system. The system and methods may be optimized to collect, isolate, and dispense a dose volume that may be used to treat a microelectronic substrate.

A substrate processing system may include a fluid source that is in fluid communication with a process chamber, in that chemicals from the fluid source may be transported through a fluid conduit to the process chamber. A dispensing device may be disposed between the fluid source and the process chamber and be in fluid communication with the fluid conduit. The dispensing device may be arranged to provide small amounts of the fluid (e.g., dose chemical) to the process chamber.

In one embodiment, the dispensing device may include a fluid delivery line or conduit that may be in fluid communication with the fluid source and the process chamber. The fluid conduit may provide a fluid path that may include several components that may control the movement of fluid through the fluid conduit and the amount of fluid that may be dispensed. Broadly, the dispensing device may include an inlet device and an outlet device that may control when fluid may be displaced into or out of the dispensing device by using sealing components to prevent fluid communication between components in the fluid conduit. The sealing components may also be used to displace portion of the fluid within a particular direction along the fluid conduit to collect and isolate the dispense volume of the dose chemical or to pressurize the fluid conduit to enable consistent fluid volume displacement through the fluid conduit. A dose device may be disposed between and in fluid communication with the inlet device and outlet device. The device may include a dose sealing component that can prevent or enable fluid communication between the inlet and outlet devices. Further, the device may include a storage component that can store a dose volume of the fluid that may be displaced towards the actuation of the outlet device or other dispensing device components.

The dispensing device components may be any actuation device that may move a sealing component to or away from a sealing surface. When the sealing component is flush with the sealing surface, the fluid flow through the component is restricted. Also, portions of the fluid conduit on either side of the dispensing device component may be no longer in fluid communication (e.g., in physical contact) with each other. The displacement component may have an open position that enables fluid communication between the inlet and outlet device and may displace or pull the fluid into the storage component. The displacement component may also have a closed position that prevents fluid communication between the inlet and outlet devices and may displace the dose volume from the storage component towards the outlet device. In one embodiment, the storage volume component may be, but is not limited to, an expandable membrane that may expand to hold the dose volume when the displacement component is in the open position and may contract to displace the dose volume when the displacement component is in the closed position.

The inlet and outlet devices may also be used to isolate the dose volume or to pressurize the fluid within the fluid conduit to enable consistent displacement of the fluid within the dispensing device. For example, the inlet device may have an open position that enables fluid communication between the inlet device and the dose device. The inlet device's closed position may prevent fluid communication between the fluid source and the dose device, in that the closed position prevents moving fluid into the fluid conduit between the inlet device and the dose device. The closing of the inlet device may also displace a portion of the fluid towards the fluid source. The outlet device may include an open position that enables fluid communication between the process chamber and the dose device. The closed position may prevent fluid communication between the process chamber and the dose device. The outlet device may also be designed to displace fluid in the fluid conduit towards the process chamber when being transitioned between the close and open position. It should be noted that the configuration of the inlet and outlet devices displace portions of the fluid in opposite directions when they are placed in the closed or open position.

In one method embodiment, the dispensing device may be operated based, at least in part, on the direction of fluid flow within the fluid conduit. In one instance, the dispensing device may receive a first inflow of fluid through the inlet device of a dose dispensing system that may enable fluid from the liquid source to fill the fluid conduit, depending on which dispensing device components are open or closed. Subsequent to filling the fluid conduit, the dispensing device may be configured to provide an outflow of the fluid from the inlet device when the inlet device is closed. The dispensing device may also be configured to receive a second inflow of the fluid through the outlet device when the outlet device transitions from the closed to open position. In this way, the fluid displacement towards the dose device, from both sides, may expand or pressurize a dose storage component with a dose volume. To dispense the dose volume, the dose device may transition to the closed position. In other embodiments, the outlet device may also dispense a portion of the dose volume if the outlet device transitions to the closed position subsequent to the closing of the dose device.

In another embodiment, the fluid conduit of the dispensing device may receive fluid or dose chemical from a fluid source. The fluid received from the fluid source may fill or pressurize a portion of the fluid conduit between the inlet device and the dose device, when the inlet device is in the open position. The inlet device may be closed and may displace a portion of the fluid towards the fluid source and isolate the dose device from the fluid source. On the opposite side of the dose device, the outlet device may be opened to pull fluid into the fluid conduit towards the dose device. The inflow of fluid may pressurize a second part of the fluid conduit, such that the storage component of the dose device may be filled with fluid or that when the dose device transitions to an open position the storage component may be filled with fluid. Next, the dispensing device may displace the dose volume from the fluid conduit. The dispensing may occur when the dose device transitions to a closed position and displaces the fluid from the storage component that may displace the same or similar amount of fluid out of the fluid conduit into the process chamber or bath. In other embodiments, the dose volume may also include a second dispense volume when the outlet device is closed and displaces another volume of fluid into the process chamber or bath.

In most embodiments, the fluid may include an incompressible fluid that may be displaced through the fluid conduit by mechanical actuation of devices disposed along the fluid conduit. For example, the fluid may include, but is not limited to, liquid chemicals, such as acids or colloidal fluids that may be used to treat microelectronic substrates.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION OF SEVERAL EMBODIMENTS

Figure 1:
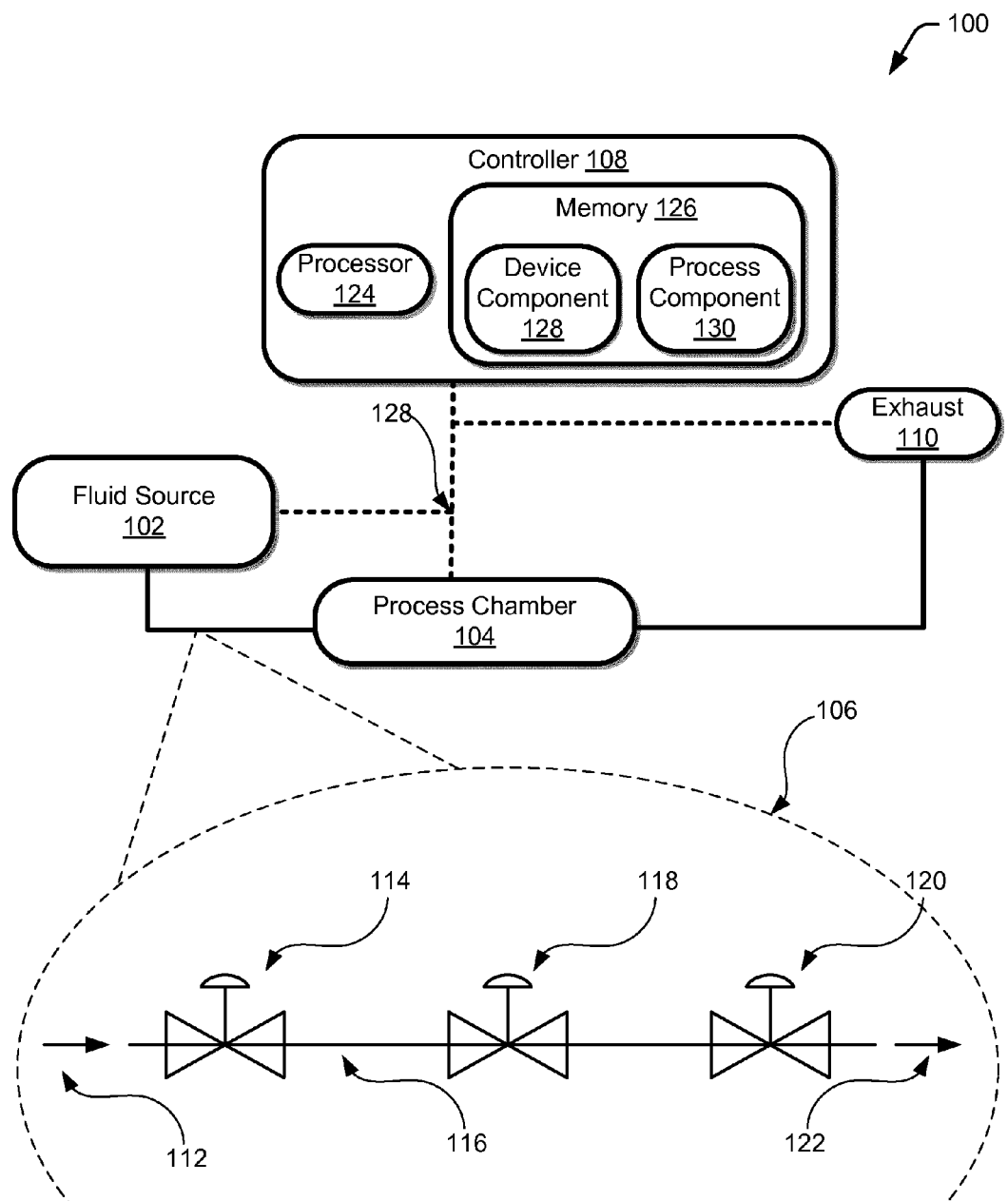
FIG. 1 illustrates a schematic representation of a process system that may include fluid source, a process chamber, and a dispensing device disposed between the fluid source and the process chamber.

Described herein are devices and methods for dispensing small amounts of a dose chemical into a larger volume of a carrier chemical that may deliver the dose chemical to a microelectronic substrate or alter the carrier chemical prior to treating the microelectronic substrate. The dispensing system may control the amount of dose chemical by priming or pressurizing the fluid within the system to avoid gas pockets or dead space within the fluid conduits of the system. The gas pockets or dead space may vary the amount of fluid that may be dispensed by altering the amount of dispensed fluid in an uncontrolled manner. The system may be designed to maintain consistent fluid concentration that enables consistent displacement of the dose chemical through the system and into a process chamber or bath.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic substrate" as used herein generically refers to the object being processed in accordance with the invention. The microelectronic substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation. In addition to microelectronic substrates, the techniques described herein may also be used to clean reticle substrates that may be used to patterning of microelectronic substrates using photolithography techniques.

FIG. 1 illustrates a schematic representation of a microelectronic substrate processing system 100 that may include fluid source 102, a process chamber 104, and a dispensing device 106 disposed between the fluid source 102 and the process chamber 104. The system 100 may also include a controller 108 that automates the processing sequence of the microelectronic substrate treatment and an exhaust system 110 that may remove process fluids from the process chamber 104.

The system 100 may be used to treat microelectronic substrates with a variety of chemical combinations that may include small concentrations of a dose chemical that may be dispensed into a larger volume of chemicals or a carrier chemical, such that the dose chemical may be equal to or less than 100 ppm of the mixed solution, in one embodiment. In other embodiments, the dose chemical concentration may be more than 100 ppm. The dose chemical may be metered and dispensed using the dispensing device 106 that may receive incoming fluid 112 to an inlet device 114 distributed along a fluid conduit 116 that may be in fluid communication with a dose device 118 and an outlet device 120. The outflow 122 of the fluid may be implemented by sequencing the actuation (e.g., open and closed positions) of these three devices to displace the fluid along the fluid conduit 116 and dispense a desired amount to the process chamber 104.

The dose fluid may include any incompressible fluid that may susceptible to displacement by mechanical means that may push and/or pull the fluid along the fluid conduit 116. The incompressible fluid may include acids or colloidal fluids that may be used to clean, etch, or remove portions of the microelectronic substrate (not shown). The mechanical means may include, but is not limited to, solenoid actuation devices (not shown) that may be opened and closed using the controller 108.

The controller 108 may use a computer processor 124 and memory 126 to execute computer-readable instructions that may be provided over an electrical communication network to control the processing system 100 components (e.g., dispensing device 106, fluid source 102, etc.). The one or more computer processors 124 may include, without limitation: a central processing unit (CPU), a digital signal processor (DSP), a microprocessor, a field programmable gate array (FPGA), or any combination thereof The memory 126 may include one or more non-transitory tangible computer-readable storage media ("CRSM") to store the instructions that may open and close the devices (e.g., inlet device 114, dose device 118, outlet device 120) to control or direct the fluid flow along the fluid conduit 116. For example, in one embodiment, the memory 126 may include a device component 128 and a process component 130 that may include instructions that when executed by the computer processor 124 may open and close the devices in a desired sequence (e.g., device component 128) or control other process parameters (e.g., temperature, flow rate, exhaust, etc.) using instructions that may be stored in the process component 130.

Figure 2:
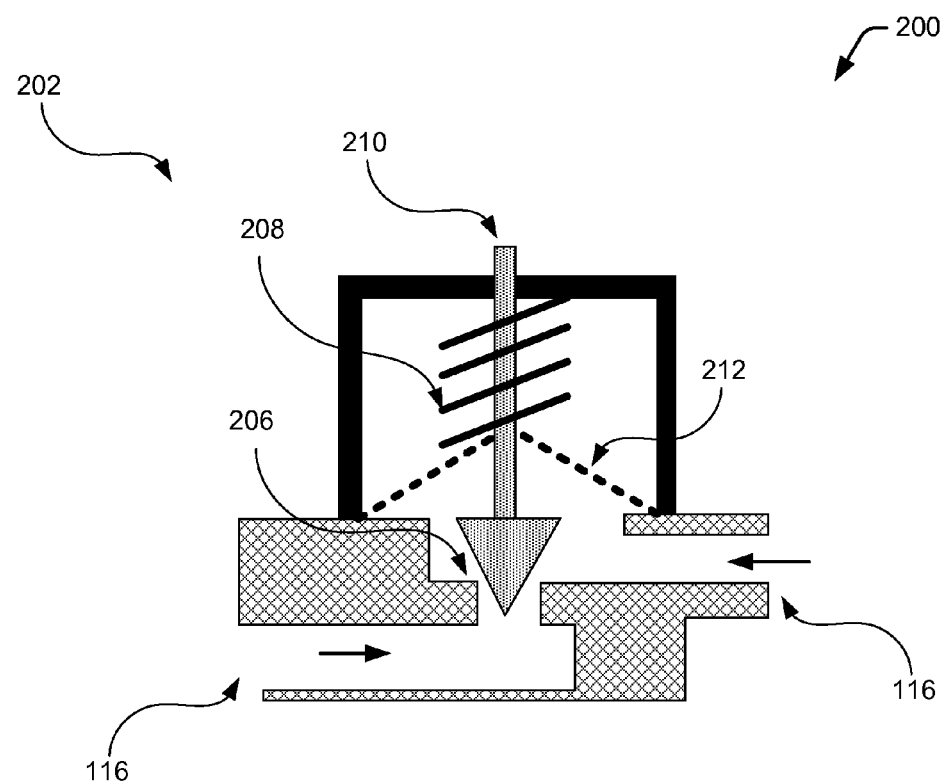
FIG. 2 illustrates one embodiment of an actuation device being in the open and closed positions.
Figure 2:
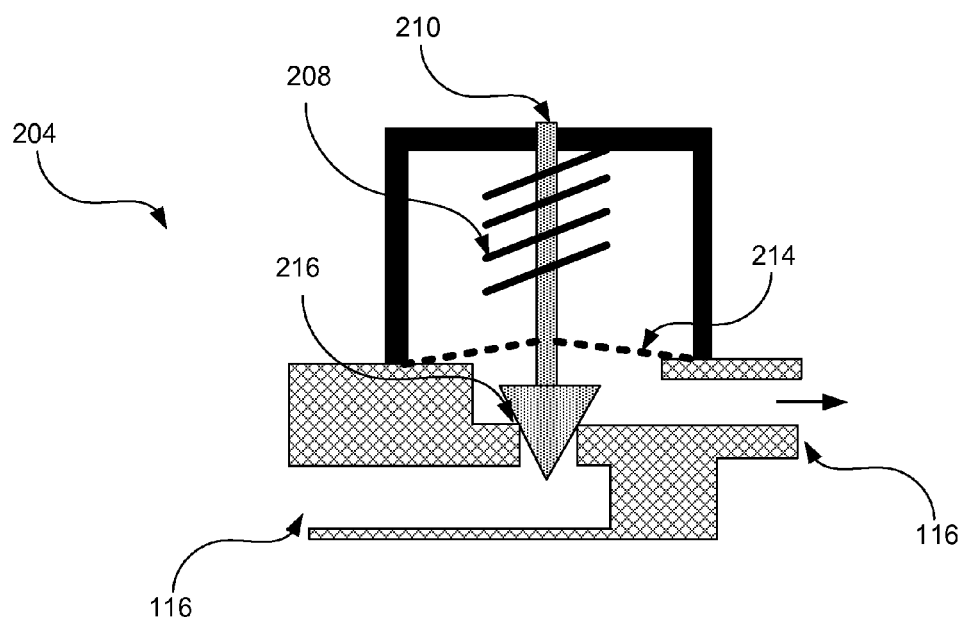
Figure 3:
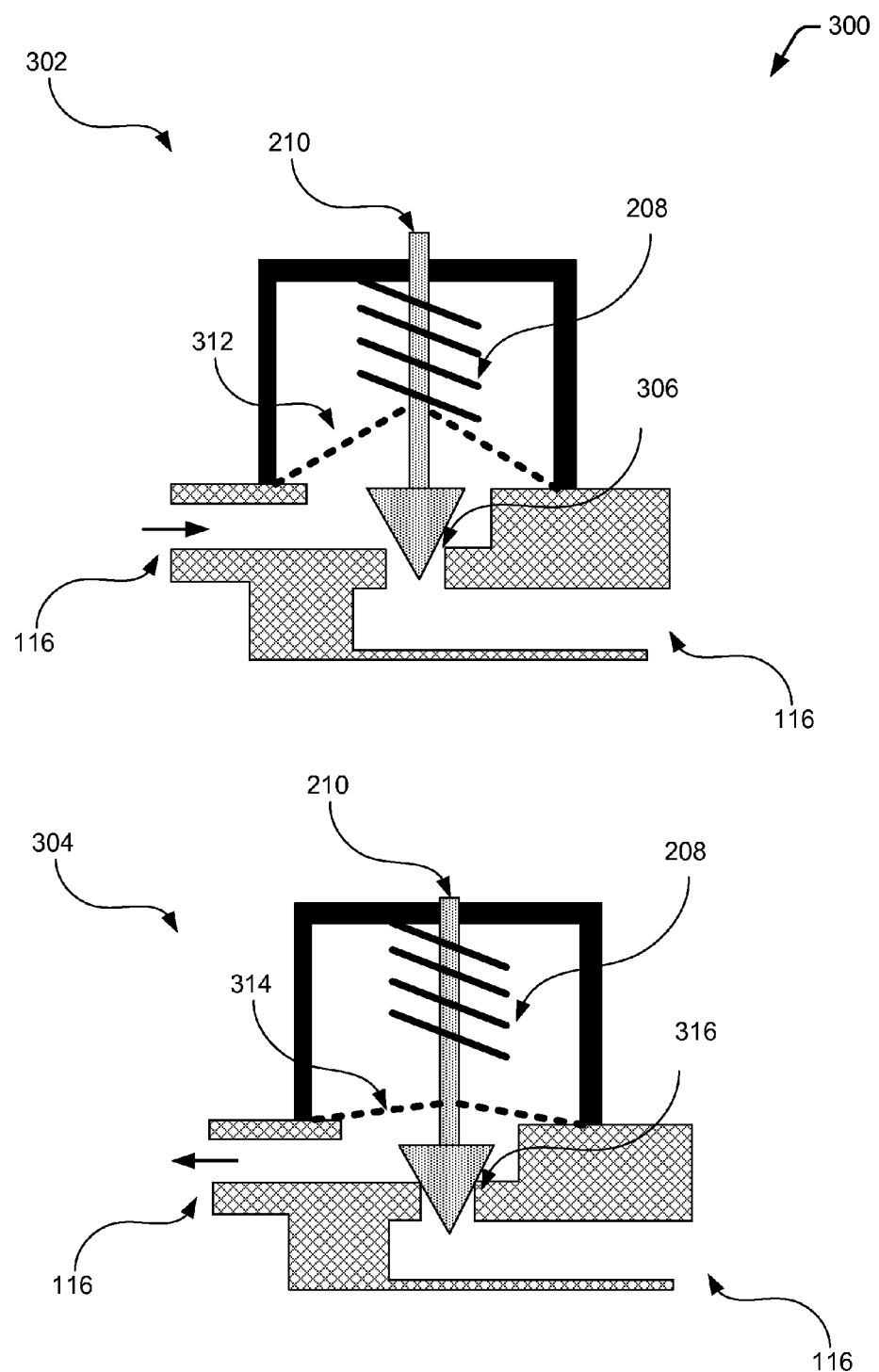
FIG. 3 illustrates one embodiment of a reverse actuation device being in the open and closed positions.

The mechanical means to push and pull the fluid may be done in a variety of ways that may be contemplated by a person of ordinary skill in the art using the device described in the description of FIGS. 2 & 3. Further, the fluid conduit 116 may have a small enough diameter that may enable a small amount of mechanical movement to push or pull the fluid to fill empty spaces within the dispensing device 106.

FIGS. 2 & 3 illustrate two embodiments of actuation devices 200, 300 that may apply a mechanical force to the fluid in the fluid conduit 116. The actuation devices 200, 300 may also limit fluid communication or fluid flow through the dispensing device 106, such that portions of the fluid conduit 116 may be isolated from each other at certain times to fill up or pressurize portions of the fluid conduit 116 with fluid. By selectively isolating portions of the fluid conduit 116 from each other, the dose device 118 may be primed to hold a dose volume within a storage area within the dose device 118.

FIG. 2 illustrates one embodiment of an actuation device 200 that is in an open position 202 that may enable fluid communication or fluid flow through the actuation device 200 and in a closed position 204 that may prevent fluid communication or fluid flow through the actuation device 200. The actuation device 200 may include an inlet 206 from the fluid conduit 116. In this embodiment, the actuation device 200 may include an actuation component 208 (e.g., solenoid, spring, etc.) that may move a sealing component 210 that may be used to open the inlet 206 to fluid flow. A expandable membrane 212 may be actuated by actuation device 200, in concert with the sealing component 210 or by itself. The expandable membrane 212 may be configured to hold a dose volume (not shown) of the fluid that may be similar to the dose volume that may be dispensed during processing. The expandable membrane 212 may be in contact with the fluid and may pull the fluid from the fluid conduit (inlet or outlet) depending on the placement of the fluid within the fluid conduit 116.

In the closed position 204, the sealing component 210 may be positioned against a sealing surface 216 to prevent fluid flow through the actuation device 200. However, the collapsed membrane 214 may apply a force to the fluid and displace an amount of fluid that may correspond to the volume change on the wetted side of the expandable membrane 212. The fluid displacement may be away from the inlet 206 due to the sealing component preventing the movement of fluid back through the inlet 206. In this illustrated embodiment, the fluid displacement may be towards the process chamber 104 when the left side of the actuation device 200 is oriented towards the fluid source 102 as shown in the arrangement of the dispensing device 106 in FIG. 1.

FIG. 3 illustrates one embodiment of a reverse actuation device 300 that may be placed in an open position 302 that may enable fluid communication or fluid flow through the reverse actuation device 300 and in a closed position 304 that may prevent fluid communication or fluid flow through the device 300. The reverse actuation device 300 may include an inlet 306 from the fluid conduit 116. Although the reverse actuation device 300 is shown to be similar to the actuation device 200, the reverse actuation device 300 may be of another design that may be contemplated by a person of ordinary skill in the art and may be different from the embodiments shown in FIG. 2 or 3.

In the FIG. 3 embodiment, the placement of the fluid conduit 116 may have an impact on the direction of the fluid displacement. The fluid from the fluid source 102 may be received from the left side of the reverse actuation device 300 and the expandable membrane 312 is more likely to be filled with fluid from the left side of the reverse actuation device 300. However, this does not mean that none of the fluid on the right side fluid conduit 116 may be used to fill the expandable membrane 312.

In the closed position 304, the displacement of the fluid may be in the opposite direction of the fluid displacement shown in FIG. 2. In this instance, when the left side of the reverse actuation device 300 is oriented towards the fluid source 102 the fluid displacement may be towards the fluid source 102 and not the process chamber 104 as shown in FIG. 2. The fluid displacement may be reversed depending on the orientation of the fluid conduit 116 and the sealing surface 216. The direction of the displacement may depend on which portion of the fluid conduit 116 is isolated from the collapsed membrane 314. In the FIG. 3 embodiment, the right side of the fluid conduit 116 is isolated from the collapsed membrane 314, hence when the collapsed membrane 314 applies a force to the fluid, the fluid may be displaced to the left side of the reverse actuation device 300.

Using a combination of actuation devices 200, 300 portions of the fluid conduit 116 may be primed or pressurized with fluid to enable fluid displacement in a desired direction based, at least in part, on the sequencing of the actuation devices 200, 300 that may be used to form the dispensing device 106.

Figure 4:
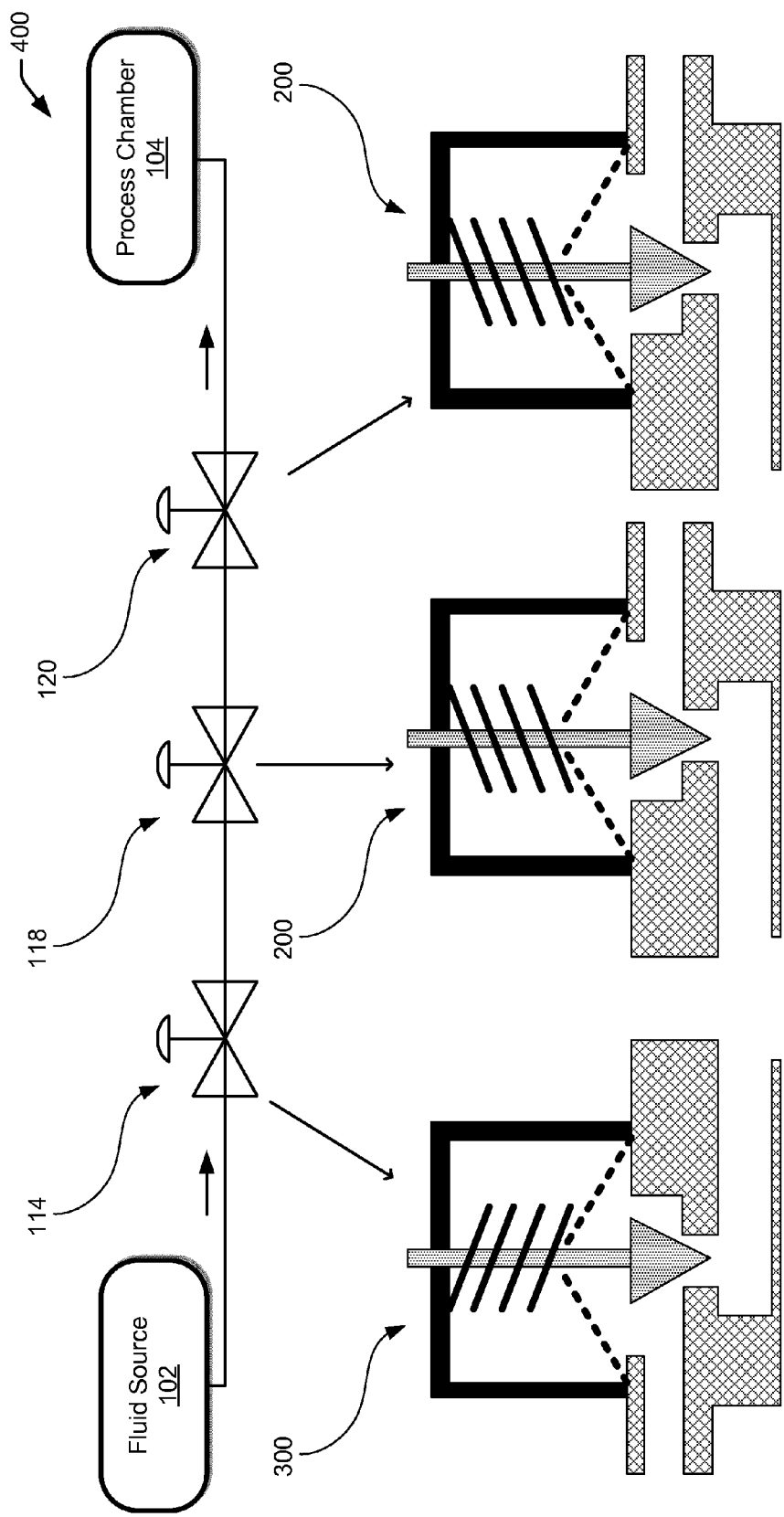
FIG. 4 illustrates one embodiment of the dispensing device showing one configuration of the arrangement of the inlet device, dose device, and outlet device.

FIG. 4 illustrates one embodiment 400 of the dispensing device 106 that may be used to control fluid displacement to collect, isolate, and dispense a dose volume of fluid towards the process chamber 104. The FIG. 4 embodiment 400 is merely one way to control fluid displacement along the fluid conduit 116. A person of ordinary skill in the art may use different actuation device 200, 300 arrangements within the dispensing device 106 to provide a dose volume to the process chamber 104.

In the FIG. 4 embodiment 400, the inlet device 114 may be the reverse actuation device 300 configuration and the dose device 118 and the outlet device 120 may have the actuation device 200 configuration. The sequencing of the devices 114, 118, 120 that may be used to collect, isolate, and dispense a dose volume will be described in the description of FIG. 5.

As noted in the descriptions of FIGS. 2 & 3, one of the differences between the reverse actuation device 300 and the actuation device 200 may include the direction of fluid displacement when the devices 200, 300 transition to a closed position. Under this embodiment 400, the inlet device 114 (e.g., reverse actuation device 300) may displace fluid towards the fluid source 102 when transitioning to the closed position 304. In contrast, the dose device 118 and the outlet device 120 (e.g., actuation device 200) may displace fluid towards the process chamber 104 when transitioning to the closed position 204. In other embodiments, the dispensing device 106 components may include the same type of actuation devices, such that the inlet device 114, dose device 118, and the outlet device 120 may all be an actuation device 200 or a reverse actuation device 300.

The opening and closing of the dispensing device 106 components, depending on their configuration, may impact the net inflow from the fluid source 102 side and the net outflow of the fluid on the process chamber 104 side. A person of ordinary skill in the art of would select dispensing device 106 components with a certain storage volume that enable the sequencing to displace the desired dose volume from the dispensing device 106. Further, the system 100 may include a plurality of dispensing device 106 that may be arranged to deliver doses simultaneously or in collaboration to dose the carrier chemical that may be used in the process chamber 104. Alternatively, the dose dispensing device 106 may dispense more than one dose to achieve the desired chemical concentration within the carrier chemical. The use of single or multiple dispensing device 106 may depend on the flow rate or volume of the carrier chemical that's being used in the process chamber 104 and how fast the dispensing device 106 can dispense a dose volume.

Figure 5:
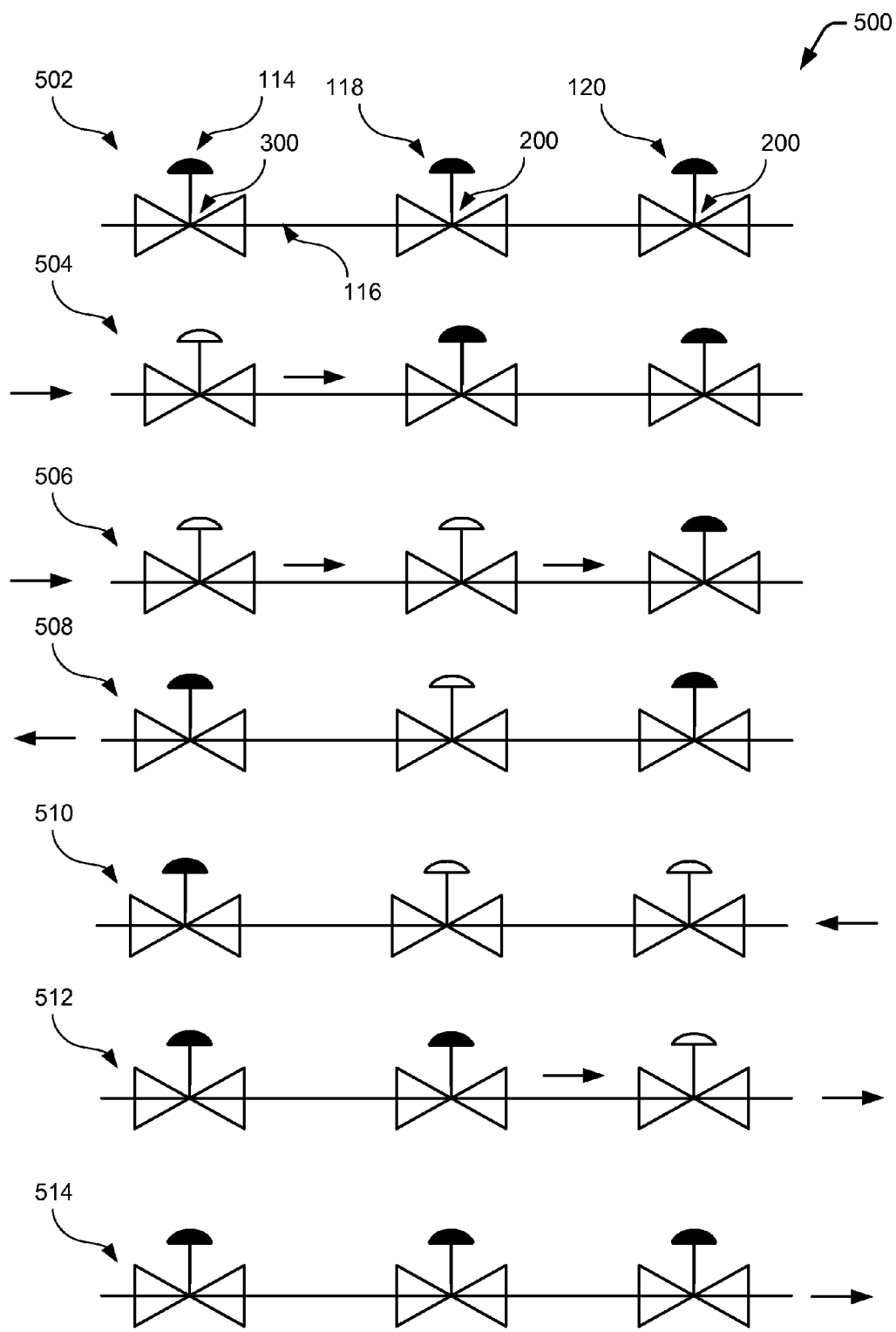
FIG. 5 illustrates one embodiment of dispensing device component sequencing to collect, isolate, and dispense the dose volume from the dispensing device.

FIG. 5 illustrates one embodiment 500 of dispensing device 106 component sequencing to collect, isolate, and dispense the dose volume to the process chamber 104. Broadly, the fluid delivery system (e.g., system 100) may deliver fluid using displacement of the fluid by mechanical means, such that the fluid may be pushed or pulled by one or more combinations of the actuation devices 200, 300.

The sequencing of the actuation devices 200, 300 may be used to collect fluid within the storage volumes (e.g., membranes 214, 314) and isolate a dose volume by priming or pressurizing the fluid to eliminate or minimize fluid gaps (e.g., gas pockets or dead space) along the fluid conduit 116. Particularly, fluid gaps disposed between the dose device 114 and the process chamber 104. Minimizing the fluid gaps or dead space (e.g., lower concentration of fluid relative to other regions of the fluid conduit 116) along the fluid conduit 116 may enable consistent displacement along the fluid conduit 116 when the dispensing device 106 components are actuated. Having a continuous or semi-continuous sample of fluid along the fluid conduit 116 may transfer fluid displacement more precisely related to the displacement of the actuation devices 200, 300. Having too many gaps or dead spaces may not allow a controlled displacement along the fluid conduit 116, in that the displacement at an upstream portion of the fluid conduit 116 may be greater than fluid displacement downstream of the initial displacement. Accordingly, the isolation of the dose volume may include filling the storage volumes within the dispensing device 106 components and minimizing gaps or dead space within the fluid conduit 116. In certain embodiments, the dispensing device 106 component sequencing may be optimized to prime or pressurize the fluid conduit 116 to enable consistent displacement of the fluid along portions of the fluid conduit 116 using the opening and closing of the dispensing device 106 components. For example, the displacement of the dose volume at the dose device 118 may transfer that displacement along the fluid conduit 116, such that the same or similar amount of fluid located downstream of the dose device 118 may be dispensed into the process chamber 104.

To minimize gaps or dead space, prior to dispensing dose volumes, the fluid conduit 116 may be pre-conditioned or primed to include fluid along at least a portion of the fluid conduit 116 between the fluid source 102 and the process chamber 104. In one specific instance, the pre-conditioning may include fluid in the fluid conduit 116 located on the process chamber 104 side of the outlet device 120. The dispensing device 106 components may be actuated in a sequence to displace that fluid upstream or downstream to minimize gaps or to isolate a continuous or semi-continuous amount of fluid between the dose device 118 and the process chamber 104.

The FIG. 5 embodiment 500 illustrates one sequencing embodiment of one dispensing device 106 component that includes a reverse actuation device 300 for the inlet device 114 and actuation devices 200 for the dose device 118 and the outlet device 120. Alternative embodiments may include different combinations of dispensing device 106 components and may have corresponding sequencing embodiments to collect, isolate, and dispense a dose volume to the process chamber 104. The sequencing embodiment described herein may include additional steps, omit certain steps, or rearrange the sequence of steps to dispense a dose volume.

For the purpose of ease of explanation and not limitation, the steps in FIG. 5 may be collated into collect, isolate, and dispense categories. For example, the initial sequence of steps may collect or distribute fluid within the dispensing device 106. The next sequence of steps may be used to isolate a dose volume within the dispensing device 106 which can include minimizing dead space within the fluid conduit 116. The last sequence of steps may be categorized as the dispense portion of the sequence where the dose volume may be dispensed from the dispensing device 106. In one embodiment, the collection sequence may include the dispensing device 106 component illustrations 502-506. The isolation sequence may include dispensing device 106 component illustrations 508-510 and the dispense sequence may include dispensing device 106 component illustrations 512-514.

In FIG. 5, the sequence steps are illustrated by schematic representation of the dispensing device 106 and the state or position (e.g., open or closed) of the dispensing device 106 components. In this instance, the black colored device handles indicate the component is closed, see closed position 204, 304, and the white colored device handles indicate the component is open, see open position 202, 302 in FIGS. 2 & 3.

In diagram 502, the dispensing device 106 is shown at an initial state with all three devices in the closed position. This indicates that any fluid within the fluid conduit 116 may be not in fluid communication with other portions of fluid on either side of the closed devices. For example, any fluid between the inlet device 114 and the dose device 118 may not be in fluid communication with any fluid between the dose device 118 and the outlet device 120, fluid on the fluid source 102 side of the inlet device 114, or fluid on the process chamber 104 side of the outlet device 120.

In diagram 504, the inlet device 114 may be transitioned to an open position which places the dose device 118 in fluid communication with the fluid source 102 that provides enough fluid to eliminate or minimize any gaps or dead space within the fluid conduit between the inlet device 114 and the dose device 118.

In diagram 506, the dose device 118 may be transitioned to an open position which places the outlet device in fluid communication with the inlet device 114 and the fluid source 102. Again, the liquid source provide enough liquid to minimize the gaps or dead space from the inlet device 114 to the outlet device 120, as indicated by the arrows along the fluid conduit 116.

In addition to minimizing gap or dead space, the expanded membrane 212, 312 may be filled with fluid in the inlet device 114 and the dose device 118. The stored fluid may be used to isolate and/or dispense the dose volume during later steps.

The net inflow from the fluid source 102 during the collection steps (e.g., 504, 506) may be considered a positive value that may include the volume of the fluid conduit 116 in the dispensing device 106 and the expanded membranes 212, 312 in the inlet device 114 and the dose device 118.

In the next steps in this sequence (e.g., 508-510) the dose volume may be isolated in the dispensing device 106. This may include priming the fluid conduit 116 and the dose device 118 and the outlet device 120 to minimize gaps or dead space in the dispensing device 106.

In diagram 508, the dose volume in the dose device 118 may be isolated from the fluid source 102 and the process chamber 104 by closing the inlet device 114 and keeping the outlet device 120 closed. In this embodiment, the inlet device 114 may be a reverse actuation device 300 that may displace a portion of the fluid towards the fluid source 102, as indicated by the arrow pointing to the left. This design may allow for the dose volume to be confined to the fluid conduit 116 between the dose device 118 and the outlet device 120. This inlet device 114 configuration may also assist in minimizing gaps or dead space for the incoming fluid conduit 116 from the fluid source 102.

In diagram 510, the outlet device 120 may be opened and the actuation device 200 design may draw fluid from the fluid conduit 116 that leads to the process chamber 104. The fluid flow into the dispensing device 106 may reduce gaps or dead space within the fluid conduit 116. At this point, the fluid in the dispensing device 106 may be considered primed for dispensing due to the reduction in gaps or dead space within the fluid conduit 116, the dose device 118, and the outlet device 120.

In diagram 512, the dose device 118 may be transitioned to a closed position 204 that displaces the fluid held in the expandable membrane 212 towards the outlet device 120. The fluid displacement may push similar amount of fluid through the outlet device 120 and the fluid conduit 116, such that the process chamber 104 may receive a similar amount of fluid from the dispensing device 106.

In diagram 514, the outlet device 120 may transition to a closed position 204 and may displace fluid from the expandable membrane 212 into the fluid conduit 116, which may dispense a similar amount of fluid into the process chamber 104. The step also returns the dispensing device 106 to starting point of the FIG. 5 sequence.

Figure 6:
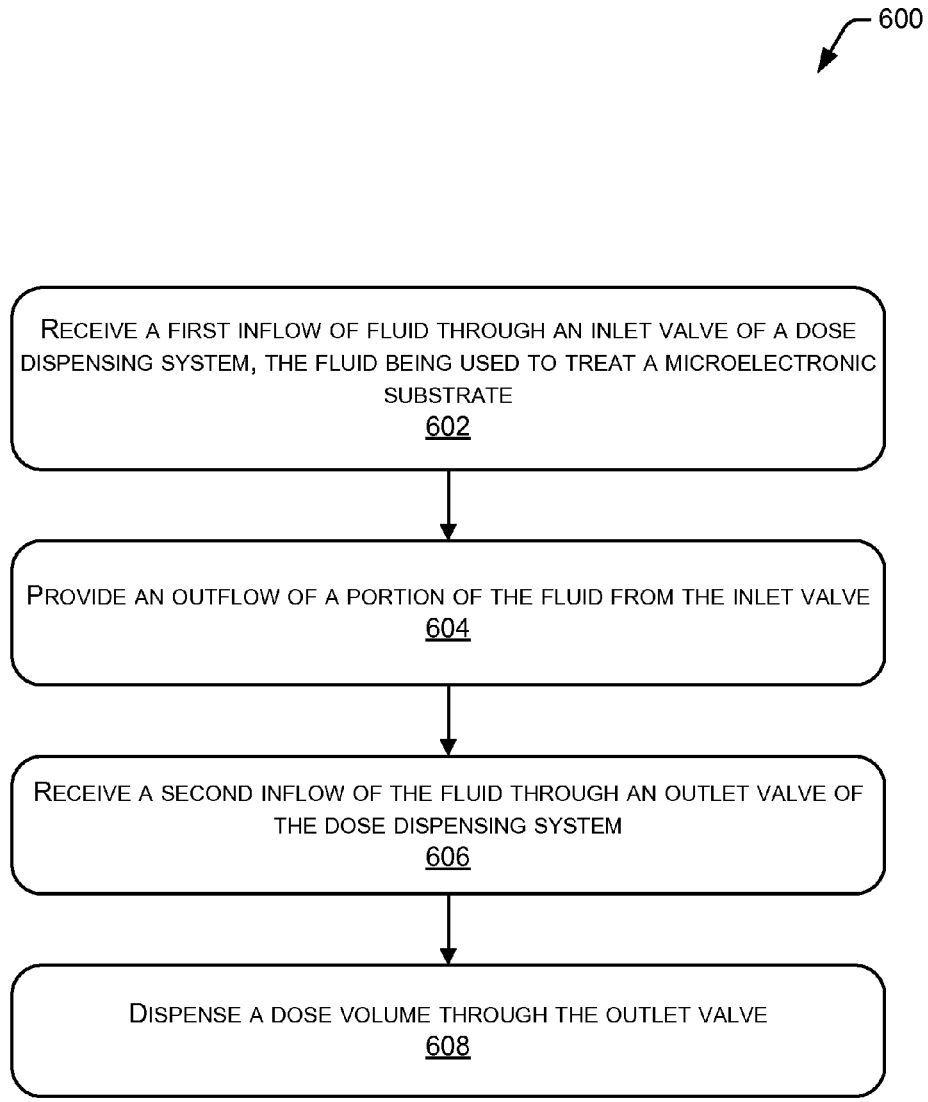
FIG. 6 illustrates a flow diagram for one method for dispensing a dose volume of fluid into a process chamber.

FIG. 6 illustrates a flow diagram 600 for one method for dispensing a dose volume of fluid from the dispensing device 106 into a process chamber 104. In one embodiment, the dose volume may be combined with another chemical solution that may be used to treat microelectronic substrates. The dispensing device 106 may be implemented using the actuation devices 200,300 described in FIGS. 2 & 3. However, the method is not limited to using those actuation device embodiments. A person of ordinary skill in the art may use different configurations of devices to practice the method illustrated in flow diagram 600. Accordingly, the method may apply to any dispensing device 106 component configuration that includes an inlet, an outlet, and a means to move the fluid through the fluid conduit 116.

As noted in the description of FIG. 5, the fluid conduit 116 may be pre-conditioned or primed with the fluid that may leave a residual amount of fluid that may be fluid communication with the outlet device 120, but may not be physically in the process chamber 104. This pre-conditioning may also be used in the implementation of the method illustrated in FIGS. 6 & 7. These methods are not limited to the steps or sequences disclosed herein. A person of ordinary skill in the art may also perform the method omitting or rearranging the sequence of the steps of the method described herein.

At block 602, the dispensing device 106 may receive a first inflow of fluid through an inlet device 114 from a fluid source 102 of the microelectronic substrate processing system 100. The fluid may be provided to fill at least a portion of the fluid conduit 116 of the dispensing device 106. In one embodiment, the fluid conduit 116 between the inlet device 114 and the outlet device 120 may be filled with the fluid. The dispensing device 106 may be used to isolate a dose volume from that fluid and to prime that fluid by removing gaps or dead space within the fluid conduit 116.

At block 604, the dispensing device 106 may isolate the dose volume closing the inlet device 114 that displaces a portion of the fluid and generates an outflow of fluid through the inlet device 114. In one embodiment, the inlet device 114 may be configured as a reverse actuation device 300 that may displace a portion of the fluid away from inlet device 114 and the outlet device 120 along the fluid conduit 116. This may be accomplished by closing the reverse actuation device 300 that pushes a volume of fluid from the expanded membrane 312 towards the fluid source 102. The closing of the inlet device 114 may also pressurize the fluid conduit between the inlet device 114 and the outlet device 120 and reduce a portion any gaps or dead space in the fluid conduit 116.

At block 606, the dispensing device 106 may also be primed from the outlet side by using the outlet device 120 to draw a second inflow of fluid from the fluid conduit 116 by opening the outlet device 120. In one embodiment, the outlet device 120 may be configured as an actuation device 200 and may draw a second inflow of fluid from the fluid conduit disposed between the dispensing device 106 and the process chamber 104. The fluid drawn from the fluid conduit 116 may be used to reduce any gaps or dead space in the fluid conduit between the inlet device 114 and the outlet device 120.

At block 608, the dispensing device 106 may dispense a dose volume towards the outlet device 120 using mechanical means that may displace at least a portion of the fluid within the fluid conduit 116. The displacement may be transferred through the fluid conduit 116, such that the dispense volume provided to the process chamber 104 may be the same or similar to the fluid displacement in the dispensing device 106.

In one embodiment, the dispensing may include closing the dose device 118 and the outlet device 120, such that the inlet device 114 may not be in fluid communication with the outlet device 120. The dispensing device 106 may also repeat the FIG. 6 sequence and dispense additional dose volumes to the process chamber 104 as needed to achieve the desired chemical concentration for the microelectronic substrate treatment.

Figure 7:
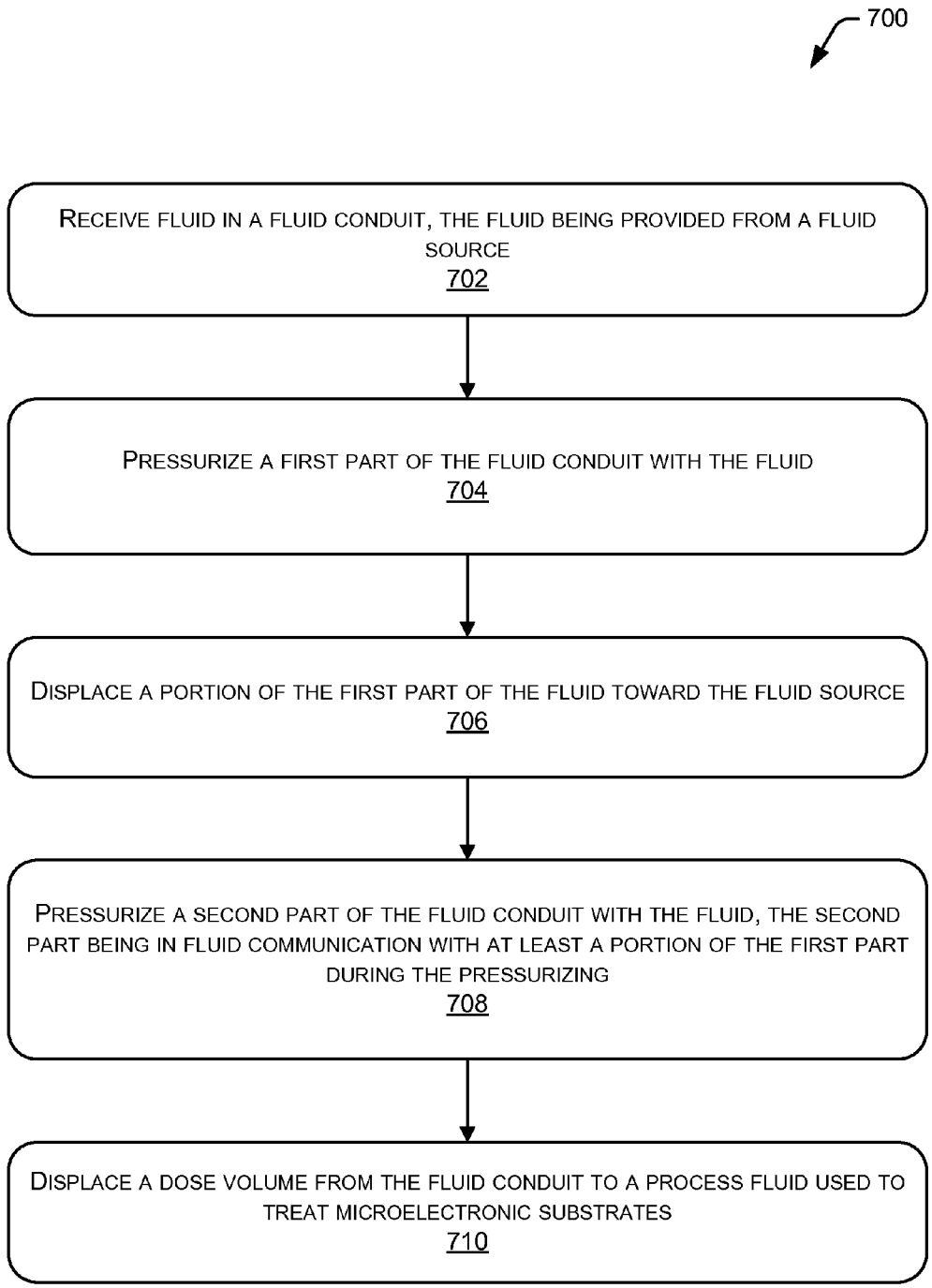
FIG. 7 illustrates a flow diagram for another method for dispensing a dose volume of fluid into a process chamber.

FIG. 7 illustrates a flow diagram 700 for another method for dispensing a dose volume of fluid from the dispensing device 106 into a process chamber 104. In one embodiment, the dose volume may be combined, prior to the process chamber 104, with another chemical solution that may be used to treat microelectronic substrates in the process chamber 104. In one embodiment, the dispensing device 106 may be implemented using the actuation devices 200,300 described in FIGS. 2 & 3. However, the method is not limited to using those embodiments. A person of ordinary skill in the art may use different configurations of devices to practice the method illustrated in flow diagram 700. Accordingly, the method may apply to any dispensing device 106 configuration that includes an inlet, an outlet, and a means to move the fluid through the fluid conduit 116.

At block 702, the dispensing device 106 may receive fluid from the liquid source via a portion of the fluid conduit 116 that runs through the dispensing device and the process chamber 104. In one embodiment, the inlet device 114 may be opened to permit the fluid to travel through the dispensing device until the fluid reaches the outlet device 120. The fluid may be an acid or a colloidal fluid used to treat microelectronic substrates. In one specific embodiment, the fluid from the fluid source 102 may be phosphoric acid.

At block 704, the dispensing device 106 may pressurize or isolate a first part of the fluid conduit 116 from the fluid source 102, such that the fluid within the dispensing device 106 may be in fluid communication with the fluid source 102, but not the process chamber. The first part may include fluid located in the fluid conduit 116 between the fluid source 102 and the dispensing device 106 and within at least a portion of the fluid conduit 116 in the dispensing device 106.

In one embodiment, the inlet device 114 may be opened to pressurize the fluid conduit 116 within the dispensing device 106, such that the inlet device 114 and the outlet device 120 may be in fluid communication with each other. This may also include opening a dose device 118, if a dose device 118 is disposed between the outlet device 120 and the inlet device 114, to enable fluid communication between each end of the dispensing device 106.

At block 706, the dispensing device 106 may isolate the fluid from the fluid source 102 and pressurize the fluid between the inlet device 114 and the outlet device 120 by displacing a portion of the first part of the fluid toward the fluid source 102. In one embodiment, the pressurizing of the first part may be done by closing the inlet device 114 that may be configured to displace fluid in the direction of the fluid source 102. For example, in one specific embodiment, the inlet device 114 may be a reverse actuation device 300 that may be configured to store a displacement volume of the fluid during the opening of the inlet device 114 as noted in the description of block 702 of FIG. 7. The displacement by the inlet device 114 may also pressurize a dose storage component that may be disposed along the fluid conduit 116 between the inlet device 114 and the outlet device 120. Any pressurizing of the fluid conduit 116 in the dispensing device 106 may reduce the amount of gaps or dead space within the fluid conduit 116 of the dispensing device 106.

At block 708, the dispensing device 106 may pressurize a second part of the fluid conduit 116 with the fluid, such that the second part may be in fluid communication with at least a portion of the first part during or subsequent to the pressurizing of the second part. The second part may include the fluid conduit 116 from the inlet device 114 to the outlet device 120. The first part and the second part areas may not have to be mutually exclusive to each other and there may be overlap between the two parts of the fluid conduit 116. In another embodiment, the second part may include the portion of the fluid conduit 116 between the dose device 118 and the outlet device 120 and the first part may include a portion of the fluid conduit 116 between the inlet device 114 and the dose device 118 or between the inlet device 114 and the outlet device 120.

In one embodiment, the pressurizing of the second part may be done by opening the outlet device 120 that may be configured to displace or pull the fluid in the direction of the fluid source 102. For example, in one specific embodiment, the outlet device 120 may be an actuation device 200 that may be configured to store a displacement volume of the fluid during the opening of the outlet device 120 as noted in the description of block 702 of FIG. 7. The displacement caused by opening of the outlet device 120 may also pressurize a dose storage component that may be disposed along the fluid conduit 116 between the inlet device 114 and the outlet device 120. The pressurizing of the second part may also reduce the amount of gaps or dead space within the fluid conduit 116 of the dispensing device 106.

At block 710, the dispensing device 106 may displace a dose volume from the fluid conduit 116 to a process chamber 104 or to a process fluid used to treat microelectronic substrates in the process chamber 104. The dose volume may be the same/similar or proportional to the displacement of one or more dispensing device 106 components that may displace (e.g., push or pull) the fluid along the fluid conduit 116.

In one embodiment, the dose volume may be dispensed by closing at least one dispensing device 106 components that may include the inlet device 114, the dose device 118, the outlet device 120, or any combination thereof. For example, the dose volume may be dispensed by closing the dose device 118. In another instance, the dose volume may be dispensed by closing the dose device 118 followed by a closing of the outlet device 120.

Although only certain embodiments of this disclosure have been described in detail above, those skilled in the art will readily appreciate that many modifications are possible in the embodiments without materially departing from the novel teachings and advantages of this disclosure. Accordingly, all such modifications are intended to be included within the scope of this disclosure.

What is claimed is:

1. A method for treating a microelectronic substrate, comprising:

providing a fluid delivery line that can contain a fluid, providing an inlet device in fluid communication with the fluid delivery line, the inlet device capable of receiving a first inflow of fluid from the fluid delivery line, and comprising a sealing component having an open position that enables fluid communication through the inlet device and a closed position that prevents fluid communication through the inlet device;

providing an outflow device in fluid communication with the inlet device and comprising a sealing component having an open position that enables fluid communication through the outlet device and a closed position that prevents fluid communication through the outlet device;

providing a dose device disposed between and in fluid communication with the inlet device and the outlet device, the dose device comprising a dose storage component capable of receiving a dose volume within a storage area, a displacement component that displaces the dose volume towards the outlet device, and a sealing component having an open position that enables fluid communication through the dose device and a closed position that prevents fluid communication through the dose device; and dispensing a dose volume of a dose chemical through the outlet device by mechanical actuation of the inlet device, outlet device and dose device into a larger amount of fluid or into a process chamber or bath for treating a microelectronic substrate.

2. The method of claim 1, wherein the dose storage component of the dose device is primed to hold a dose volume within the storage area by placing the sealing component of the outlet device in a closed position.

3. The method of claim 1, wherein the dose volume is dispensed in an amount sufficient to provide a mixed solution having a concentration of the dose chemical in the mixed solution equal to or less than 100 ppm.

4. The method of claim 1, wherein the dose chemical comprises an acid or a colloidal fluid.

5. The method of claim 1, wherein the inlet device comprises a dose storage component capable of receiving a dose volume within a storage area and dispensing a dose volume from the storage area.

6. The method of claim 5, wherein the dose volume of the inlet device is dispensed from the storage area away from the direction of the larger amount of fluid, process chamber or bath for treating a microelectronic substrate.

7. The method of claim 1, wherein the outlet device comprises a dose storage component capable of receiving a dose volume within a storage area and dispensing a dose volume from the storage area.

8. The method of claim 7, wherein the dose volume of the outlet device is dispensed from the storage area away from the direction of the larger amount of fluid, process chamber or bath for treating a microelectronic substrate.

9. The method of claim 7, wherein the dose volume of the outlet device is dispensed from the storage area in the direction of the larger amount of fluid, process chamber or bath for treating a microelectronic substrate.

10. The method of claim 1, wherein the storage area defined at least in part by an expandable membrane.

11. The method of claim 10, wherein the dose volume is displaced from the dose storage component by contraction of the membrane when the sealing component of the dose device is in the closed position.

12. The method of claim 10, wherein the dose volume is displaced from the dose storage component by contraction of the membrane when the sealing component of the dose device is in the closed position.

13. The method of claim 10, wherein the dose volume is displaced from the dose storage component by actuation of an actuation device when the sealing component of the dose device is in the closed position.

14. The method of claim 13, wherein the actuation device is selected from a solenoid or a spring.

15. The method of claim 10, wherein the dose volume is displaced from the dose storage component by actuation of an actuation device when the sealing component of the dose device is in the closed position.

16. The method of claim 15, wherein the actuation device is selected from a solenoid or a spring.

* * * * *

UNITED STATES PATENT AND TRADEMARK OFFICE
CERTIFICATE OF CORRECTION

Page 1 of 1

PATENT NO. : 9,982,664 B2
APPLICATION NO. : 14/815467
DATED : May 29, 2018
INVENTOR(S) : William P. Inhofer and Lance Van Elsen It is certified that error appears in the above-identified patent and that said Letters Patent is hereby corrected as shown below:

In the Claims

Column 13, Line 21: "providing an outflow device in fluid communication with" should be
– providing an outlet device in fluid communication with –

Signed and Sealed this
Seventeenth Day of March, 2020

Andrei Iancu
*Director of the United States Patent and Trademark Office*